US009847241B2

(12) United States Patent
Freundt et al.

(10) Patent No.: US 9,847,241 B2
(45) Date of Patent: Dec. 19, 2017

(54) TRANSPORT MODULE FOR A SEMICONDUCTOR FABRICATION DEVICE OR COUPLING DEVICE

(71) Applicant: AIXTRON SE, Herzogenrath (DE)

(72) Inventors: Martin Freundt, Esslingen (DE); Walter Franken, Eschweiler (DE)

(73) Assignee: AIXTRON SE, Herzogenrath (DE)

( * ) Notice: Subject to any disclaimer, the term of this patent is extended or adjusted under 35 U.S.C. 154(b) by 161 days.

(21) Appl. No.: 14/785,308

(22) PCT Filed: Apr. 16, 2014

(86) PCT No.: PCT/EP2014/057750
§ 371 (c)(1),
(2) Date: Oct. 16, 2015

(87) PCT Pub. No.: WO2014/173758
PCT Pub. Date: Oct. 30, 2014

(65) Prior Publication Data
US 2016/0079104 A1 Mar. 17, 2016

(30) Foreign Application Priority Data
Apr. 22, 2013 (DE) .................. 10 2013 104 030

(51) Int. Cl.
*H01L 21/677* (2006.01)
*F16K 3/02* (2006.01)
(Continued)

(52) U.S. Cl.
CPC ..... *H01L 21/67778* (2013.01); *B25J 11/0095* (2013.01); *F16J 15/02* (2013.01);
(Continued)

(58) Field of Classification Search
CPC .. H01L 21/67775; F16J 15/021; F16J 15/028; F16K 3/0227; F16K 3/20
See application file for complete search history.

(56) References Cited

U.S. PATENT DOCUMENTS 5,364,219 A * 11/1994 Takahashi ......... H01L 21/67724
118/719
6,273,664 B1 * 8/2001 Doche ............... H01L 21/67126
118/719
(Continued)

FOREIGN PATENT DOCUMENTS

EP 0891629 B1 8/2005
KR 1020090017887 A 2/2009

OTHER PUBLICATIONS

International Search Report and Written Opinion, from the European Patent Office, dated Jul. 9, 2014, for International Patent Application No. PCT/EP2014/057750 (filed Apr. 16, 2014), 11 pgs.

*Primary Examiner* — James Keenan
(74) *Attorney, Agent, or Firm* — Ascenda Law Group, PC

(57) ABSTRACT

A transport module for loading and unloading a process module of a semiconductor production device includes a housing, which has a chamber that can be evacuated. The chamber has an opening that can be closed in a gas-tight manner by a closure device, which opens out into a first coupling duct associated with the transport module. The first coupling duct is connected with a flange plate using an elastic intermediate element, wherein the flange plate can be seated in a plane parallel, sealing manner on a flange plate of a second coupling duct associated with the process module. After opening the closure device, an evacuated loading and unloading duct to the process module is created. An inner and outer mounting section of the intermediate element is spaced apart from one another in the radial direction, with respect to the axis of the first coupling duct, by a deformation zone.

12 Claims, 6 Drawing Sheets

(51) Int. Cl.
*H01L 21/67* (2006.01)
*B25J 11/00* (2006.01)
*F16J 15/02* (2006.01)

(52) U.S. Cl.
CPC ...... *F16K 3/0227* (2013.01); *H01L 21/67126* (2013.01); *H01L 21/67775* (2013.01)

(56) References Cited

U.S. PATENT DOCUMENTS

| | | | |
|---|---|---|---|
| 6,393,716 B1* | 5/2002 | Chang | H01L 21/67775 34/402 |
| 6,793,766 B2* | 9/2004 | Schieve | C23C 16/54 118/719 |
| 7,771,150 B2* | 8/2010 | Hugler | H01L 21/67126 414/217 |
| 7,845,892 B2* | 12/2010 | Hugler | H01L 21/67126 414/217 |
| 8,097,084 B2 | 1/2012 | Geiser et al. | |
| 8,505,875 B2* | 8/2013 | Mahr | F16K 3/0227 251/193 |
| 9,016,501 B2* | 4/2015 | Hara | H01L 21/67772 220/230 |
| 9,383,036 B2* | 7/2016 | Kamibayashiyama | F16K 3/0227 |
| 2004/0227100 A1 | 11/2004 | Casa et al. | |
| 2014/0175310 A1* | 6/2014 | Coppola | F16K 51/02 251/85 |

* cited by examiner

Fig. 3
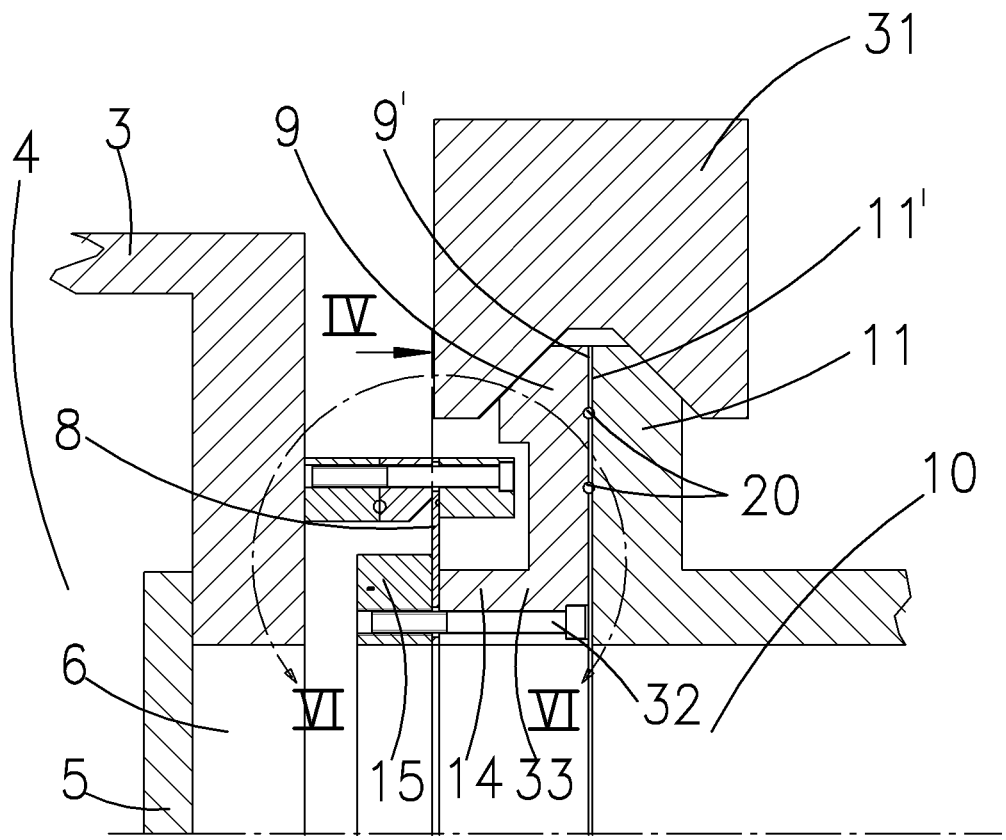
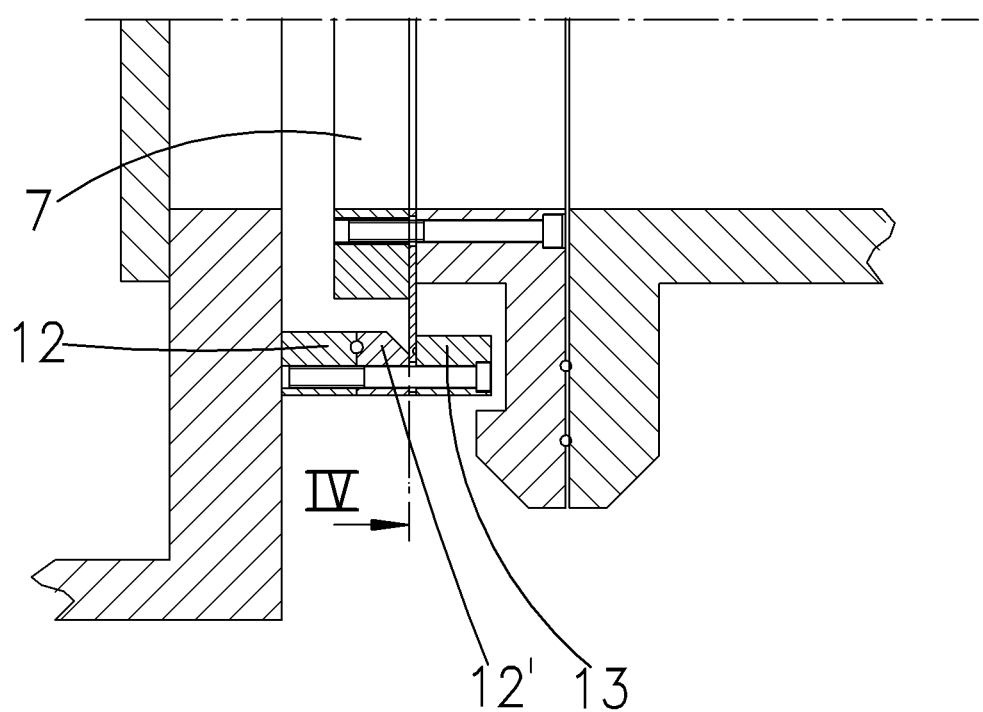

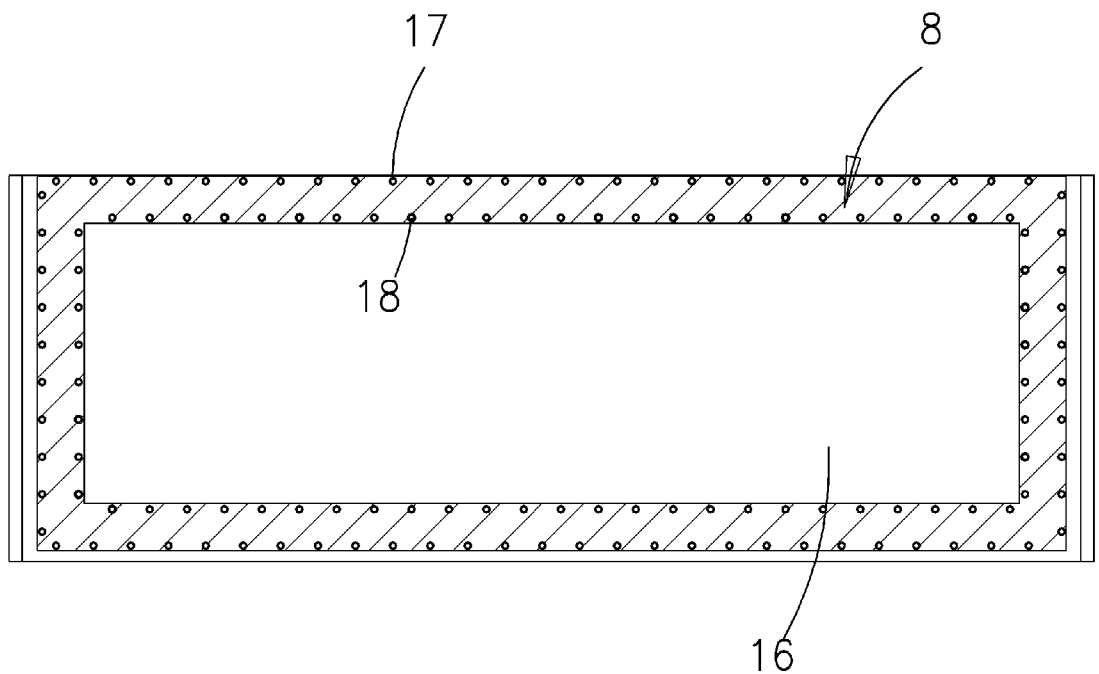

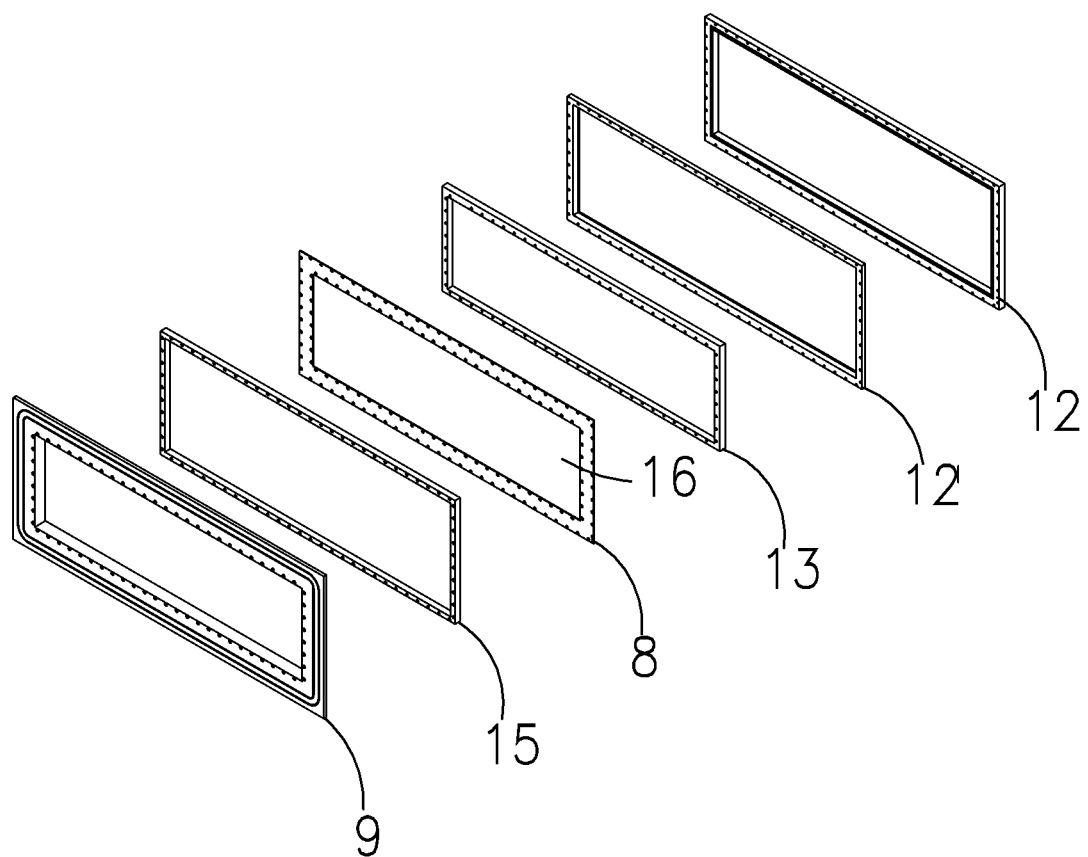

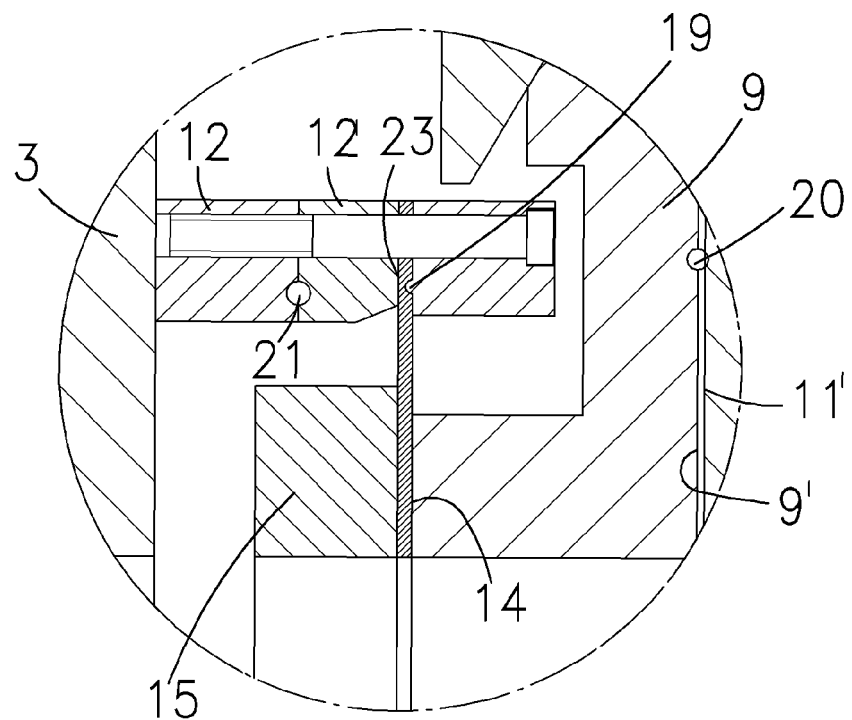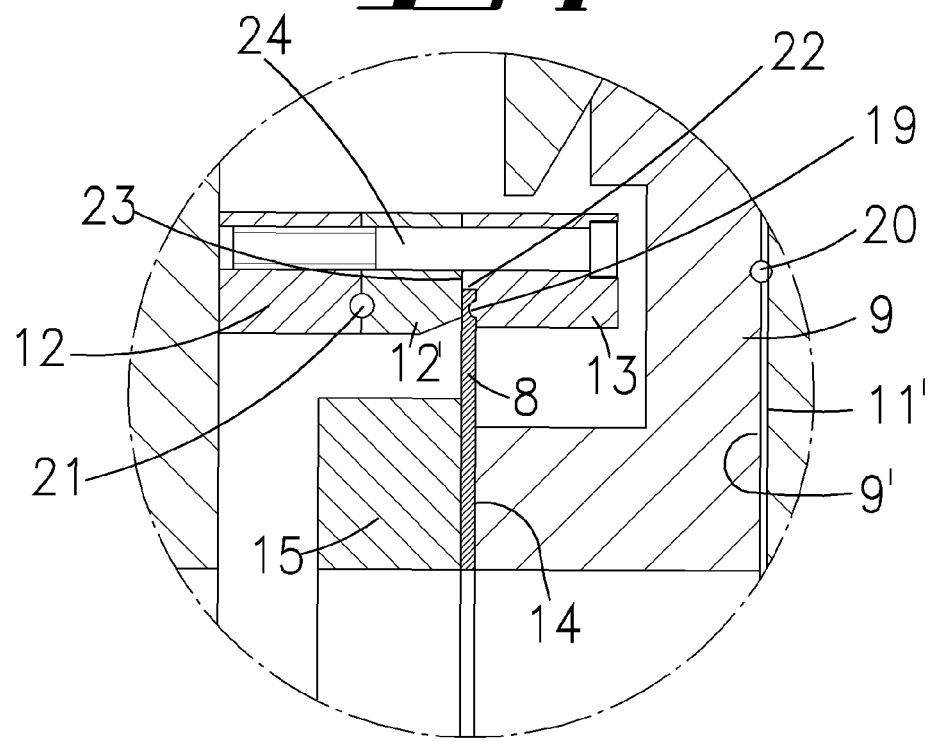

TRANSPORT MODULE FOR A SEMICONDUCTOR FABRICATION DEVICE OR COUPLING DEVICE

RELATED APPLICATIONS

This application is a National Stage under 35 USC 371 of and claims priority to International Application PCT/EP2014/057750 filed 16 Apr. 2014, which claims priority to DE Application 10 2013 104 030.6 filed 22 Apr. 2013, which is incorporated herein by reference.

FIELD OF THE INVENTION

The invention concerns a transport module and also a coupling device for purposes of creating a loading and unloading duct between the transport module and a process module of a semiconductor production device by bringing together a flange plate of a coupling duct of the transport module, and a flange plate of a coupling duct of the process module, in a plane parallel manner, wherein one of the two flange plates, and in particular that of the transport module, is connected using an elastic intermediate element with the coupling duct that is associated with it, wherein the intermediate element has two mounting sections, of which one is connected with the flange plate, and the other is connected with the wall of the coupling duct.

BACKGROUND

A coupling device for purposes of coupling a transport module with a process module is described in KR 10 2009 0 017 887 A. The coupling device consists of two coupling ducts, each having walls, which have flange plates that can be brought together in a plane parallel manner. One of the flange plates is elastically connected with the related wall of the coupling duct.

A coupling duct formed from a frame, which has a flange plate, which can be tilted as a result of an elastic connection with a frame-type wall of the coupling duct, is described in U.S. Pat. No. 8,097,084 B2.

In EP 0 891 629 B1 a transport module is described, which can be displaced between a plurality of process modules. The process module possesses a flanged connector, onto which a flanged connector of the transport module can be flanged. Here the sealing faces of the flange plates must be located against each other in a plane parallel manner. The flanged connector of the process module and the flanged connector of the transport module each form a coupling duct; in the coupled state they are aligned with one another and form a loading and unloading duct. The said duct is evacuated. Closure devices are then opened, which otherwise close off the coupling duct from an inner chamber. The chamber of the transport module is then connected with the chamber of the process module, such that by means of a gripper, which is associated with the transport module, a susceptor, which carries semiconductor discs that are coated, or that are to be coated, can be transported through the loading and unloading duct. Since the transport module is movable, in general terms no plane parallelism exists between the two flange plates. In the prior art, for purposes of compensating for an angle tolerance or a distance tolerance between the flange plates, an elastic intermediate element is provided in the form of a bellows.

The latter extends in the axial direction with respect to an axis defined by the extensive direction of the loading and unloading duct.

The task underlying the present invention is that of configuring a more compact transport module, wherein, however, the adaptability of the flange plate to tolerances remains intact.

SUMMARY OF THE INVENTION

The task is solved by means of the invention specified in the claims. Firstly and essentially it is proposed that the elastic intermediate element has two radial distances that differ from one another with respect to the mounting sections extending along the axis of the coupling duct. A deformation zone extending in the radial direction is located between the mounting sections. The intermediate element, having in particular the function of a sealing element, can be formed from a membrane extending in one plane. The two mounting sections can be formed by a region near the edge of either an outer or an inner edge region of the window frame-shaped sealing element. One of the two mounting sections is connected with the flange plate, in particular its holding frame, and the other mounting section is connected with the wall of the coupling duct, that is to say, with the mounting frame, and in particular its front edge region. Between the two mounting sections there exists a clearance distance. The elastic intermediate element is thus a sealing element extending in a radial plane with respect to the axis, which between its mounting sections, which are formed from an outer and an inner edge region, forms the flexurally elastic deformation zone surrounding the coupling duct. The front face of the flange section of a flange element carrying the flange plate can thereby be mounted on the inner edge region of the window frame-shaped sealing element, and the front face of the wall of the coupling duct can be mounted on the outer window frame edge region. In between, there extends a deformable surface area section of the intermediate element, such that a radially displaced mounting of the sealing element is provided on the wall of the coupling duct, and on a holding frame of the flange plate, respectively. The sealing element possesses an extent in one plane. It takes the form of an essentially plane surface structure, namely of a membrane, which can consist of plastic or metal. However, within the surface extent the membrane can also have structures projecting out of an exact plane, such as, for example, waves, creases, or similar. The said membrane frames the coupling duct of the transport module and has a window for this purpose. The coupling duct extends through the window. The sealing element can be elastically or plastically deformable. It can consist of an elastomer. The material can be a sealing material, such as is used for vacuum seals, e.g. O-rings. The mounting of the membrane onto the flanged connector, or onto a mounting frame of the transport module, can be undertaken by means of a clamping frame. An outer edge region of the sealing element is thereby clamped between a seating face of a mounting frame, which is connected in a fixed manner with the housing of the transport module, and a holding frame. In the edge region of the sealing element is located a multiplicity of mounting openings, through which pass mounting screws, with which the holding frame is clamped against the mounting frame. At the same time a peripheral rib can embed itself into the surface of the sealing element. The edge region of the window is also connected, with the aid of a holding frame, with a land of the flange element, which forms the flange plate, which as a result of the elastic intermediate element can assume variably inclined locations relative to the housing of the transport module. The membrane can also be supported against vacuum forces in another manner. It is also possible to configure the mounting of the membrane in another manner, for example the membrane can also be mounted with adhesive onto, welded to, or vulcanised onto the mounting frame, or the flange element. However, the membrane is preferably compressed between a land and a frame. In order to engage the two flange plates located in a plane parallel manner with each other in a plane parallel location before the evacuation of the loading and unloading duct, a clamp is provided, which engages on the outer inclined flanks of the flange plates so as to press the seals of one of the flange plate surfaces against the other flange plate surface. As a consequence of the sealing element the flange plate associated with the transport module can be displaced, both in the axial direction with respect to the extensive direction of the coupling duct, and also in an inclined position thereto.

BRIEF DESCRIPTION OF THE DRAWINGS

In what follows examples of embodiment of the invention are explained with the aid of accompanying drawings. Here:

FIG. 3 shows a section along the line III-III in FIG. 2;

FIG. 4 shows a plan view onto the sealing element 8 along the section line IV-IV in FIG. 3;

FIG. 5 shows an exploded view of the flange arrangement of the transport module 1;

FIG. 6 shows an enlarged detail VI-VI in FIG. 3, and

FIG. 7 shows a representation in accordance with FIG. 6, but in a variant.

DETAILED DESCRIPTION

Figure 1:
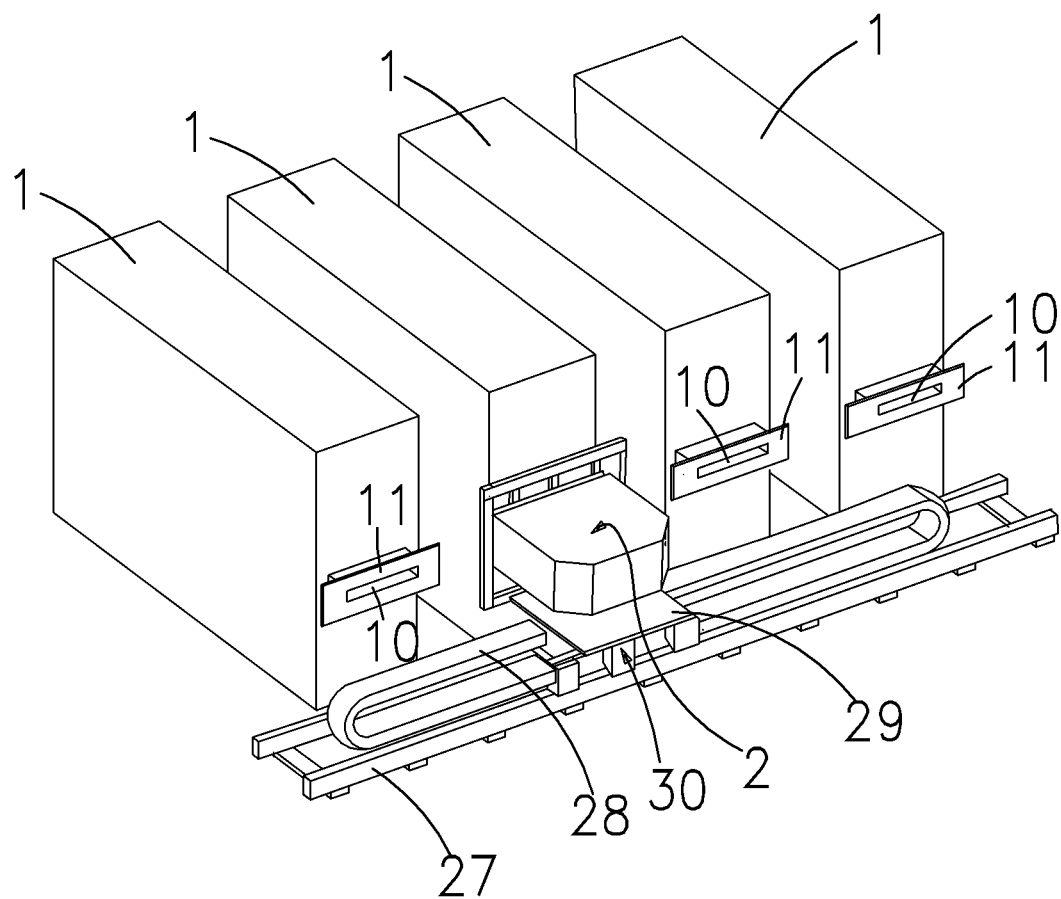
FIG. 1 shows in a perspective representation four process modules 1, which can optionally be connected with a transport module 2, which can be displaced on rails 27.
Figure 2:
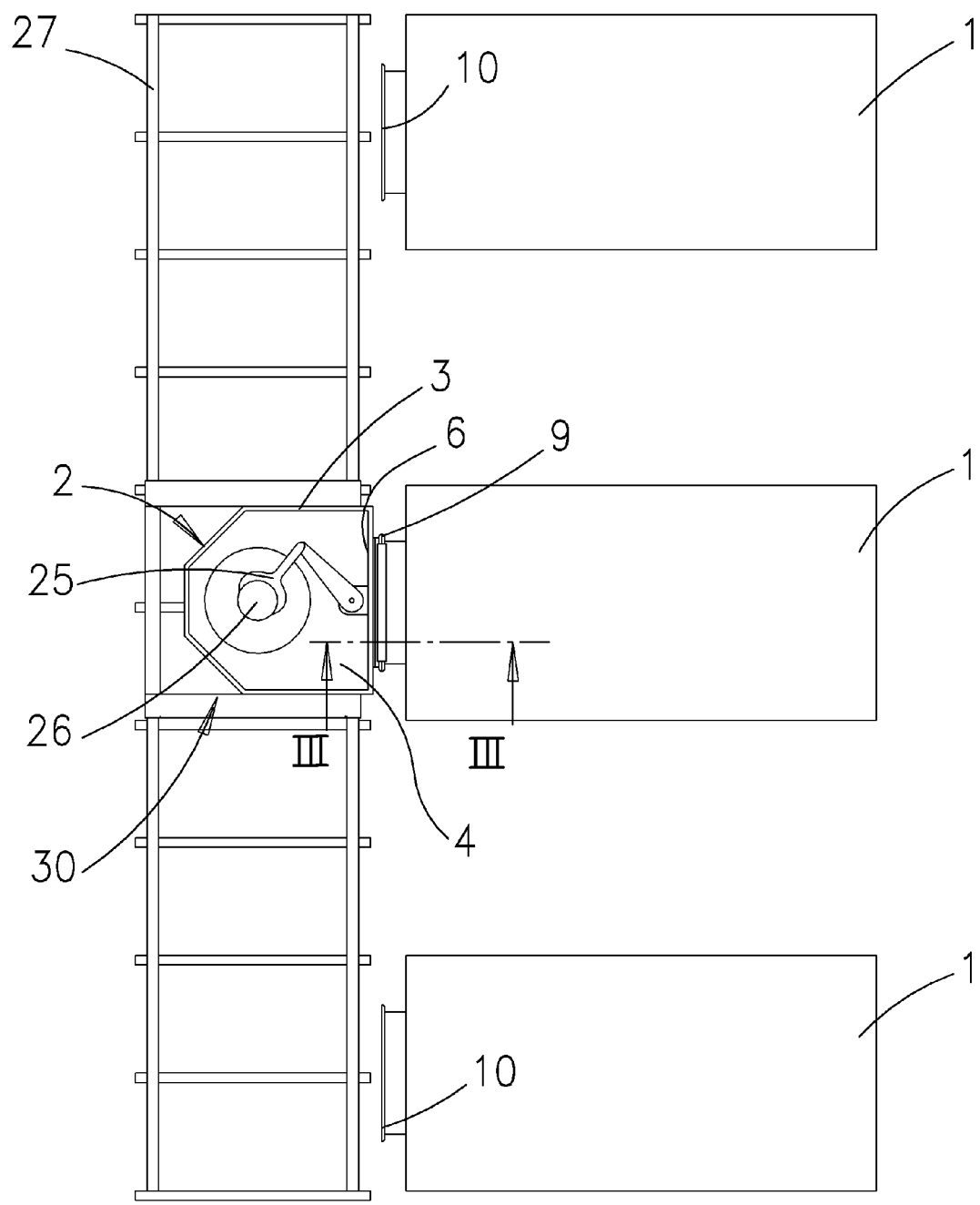
FIG. 2 shows the plan view onto three process modules 1 and onto the rail arrangement 27, wherein the transport module 2 is connected with the central process module 1.

FIGS. 1 and 2 show elements of a semiconductor production device. A total of four or three process modules 1 are represented respectively, in which process steps in the semiconductor production are executed under vacuum conditions, or low-pressure conditions. For example, in the process modules 1, layers are deposited on substrates of a semiconductor material using the MOCVD method. Here the essentially circular substrates are located on susceptors, which form the bases of process chambers that are not represented in the figures. At the same time the said susceptors form a means of transport, in order to transport the semiconductor substrates that are to be coated, or are already coated, from one process module 1 to another process module 1, or to an unloading and loading station that is not represented.

The transport module 2 serves to provide the transport in this respect; this is represented in FIG. 2 without the cover of a housing 3. Within the housing 3 of the transport module 2 a gripper 25 is located, which can grip a susceptor 26; the latter can be brought out of the chamber 4 of the transport module 2, through an opening 6, and into the process module 1. Via the rails 27 the transport module 2 can be traversed between the individual process modules 1. Here the housing 3 of the transport module 2 is located on a rack 29 of a carriage 30, and can be moved transversely relative to the extensive direction of the rails 27. Via a flexible supply duct 28 the transport module 2 is connected with a supply device that is not represented.

Each process module 1 possesses a flanged connector, which forms a flange plate 11, which borders a coupling duct 10. The coupling duct 10 is connected to a chamber, not represented, of the process module 1 using gas-tight connecting elements, not represented, such that vacuum conditions can prevail inside the process module 1.

The housing 3 of the transport module 2 possesses an opening 6, which is closed using a closure slider 5, such that vacuum conditions prevail inside the chamber 4 of the transport module 2.

The opening 6 opens out into a coupling duct 7, which is bordered by a mounting frame 12. In the example of embodiment the mounting frame 12 consists of two frame elements 12, 12' that are bolted together. The front face, pointing outwards, of the mounting frame 12', which with the aid of a seal 21 is connected with the mounting frame 12, forms a seating face 23, against which the outer edge region of a sealing membrane 8 is located. The sealing membrane can consist of plastic or metal. A suitable material for the sealing membrane is, for example, Viton.

On one side the edge region of the sealing membrane 8 is supported on the seating face 23, and on the other side pressure is applied by a holding frame 13. The holding frame 13 extends over the whole length of the edge region of the rectangular sealing element 8, as does the seating face 23. The said edge region possesses a multiplicity of mounting openings 17, through each of which pass mounting bolts 24, with which the holding frame 13 is pressed against the seating face 23. The sealing membrane 8 that is located in between is thereby compressed such that a vacuum-tight connection is created.

From FIG. 6 it can be seen that the sealing face of the holding frame 13 possesses a peripheral rib 19, which presses into the surface of the sealing membrane 8.

FIG. 7 shows a variant in which the holding frame 13 features a projection 22, which is located such that it makes contact with the seating face 23. The rib 19 thus extends into a clearance space in which the edge region of the sealing element 8 is accommodated. The clearance width is defined by the step height of the projection 22.

From FIG. 4 it can be seen that the sealing element forms a rectangular window 16. The edge region of the window 16 possesses a multiplicity of mounting openings 18. Through these mounting openings 18 pass mounting bolts 32, with which a holding frame 15 is pressed against a land 14 of a flange element, which forms the flange plate 9.

From FIGS. 3 and 6 it can be seen that the holding frame 15 extends within the space that is bordered by the mounting frames 12,12'. The holding frame 15 is radially spaced apart from the mounting frames 12,12', such that the holding frame 15 can be displaced both in the axial direction with respect to the extensive direction of the coupling duct 7, and also in a direction that is inclined with respect to the said axis. By this means the body connected rigidly with the holding frame 15 and forming the flange plate 9 can also be displaced in the axial direction and in the inclined direction.

In the production of the flanged connector of the transport module 2 the mounting frames 12, 12' are firstly connected with the housing 3, wherein a seal 21 is arranged between the two frame elements 12, 12'. The outer edge region of a rectangular sealing membrane 8 is mounted onto the mounting frame 12 with the aid of the holding frame 13, wherein the edge region of the sealing membrane 8 is compressed between the holding frame 13 and the seating face 23. A holding frame 15 is then positioned against the rear face of the edge section of the sealing element 8 bordering the window 16; the holding frame 15 is bolted onto the flanged body by means of mounting bolts 32 inserted from the sealing face 9'. The holding frame 15 can be placed in this position before the holding frame 13 is mounted.

The flanged body forms a flange plate 9, which forms a planar sealing face 9', in which are located two seals 20 in peripheral grooves that extend around the coupling duct 7.

By displacement of the transport module 2 along the rail 27, and/or transverse to the latter relative to a rack 29, the flange plate 9 of the transport module 2 can be brought into contact with the flange plate 11 of a process module 1. The edge regions of the two flange plates 9, 11 form inclined flanks, on which engage the inclined flanks of a clamp 31, which presses the two flange plates 9, 11 together such that the two sealing faces 9', 11' are aligned in a plane parallel manner, and the seals 20 are located against the sealing face 11' of the flange plate 11 so as to form a seal. Here any slight angular displacement is compensated for by the elasticity of the sealing element 8.

The coupling duct 7 and 10 is then evacuated using a vacuum pump that is not represented. The closure slider 5 is then opened, such that an open loading and unloading duct to the chamber 4 of the transport module is created; this is formed by the two coupling ducts 7, 10 that are aligned with one another.

The clamp 31 can be part of a clamping frame that has clamping arms that engage with a plurality of edge regions of the flange plates 9, 11. For this purpose pressure can be applied onto the arms by a compression spring. The arms can be brought into a clearance position by means of pneumatic elements. Mechanical tolerances are thus compensated for in the positioning of the clamps 31. At the same time the elastic intermediate element 8 can deform.

The innovation enables a compact build for the transport module, since the distance between the flange plate 9 and the housing wall 3 can be minimised. The sealing element 8 extends essentially exclusively in the radial direction, with respect to the extensive direction of the coupling duct 7. This has the consequence that one holding frame 15 is located within the mounting frame 12, and one holding frame 13 is located radially externally to a flange section 33 of the flanged body. By this means a radial nesting of the sealing elements is provided.

In the example of embodiment the edge region of the window is connected with the flange element. In an example of embodiment that is not represented the edge region of the window 16 is connected with the mounting frame 12 fixed to the housing 3, and the outer edge region of the sealing element 8 is connected with the flanged body.

The variant represented in FIG. 7 has the advantage compared with the variant represented in FIG. 6 that the clearance accommodating the edge region of the sealing membrane 8 has a minimum clearance width, such that the edge region of the membrane 8 is located in a clearance of equal width over the whole peripheral length.

The membrane can consist of Viton. However, it can also consist of a suitable metal. It is a planar, two-dimensional structure.

In a further example of embodiment the inner edge region of the membrane, that is to say, the edge region of the window 16, can similarly be located in a clearance with a closed base, to which end the holding frame 15 can possess a projection, which corresponds to the projection of the holding frame 13. Provision can also be made for the holding frame 15 similarly to possess a peripheral sealing rib, which in the same manner as the sealing rib 19, is pressed into the surface of the elastic membrane 8.

The above embodiments serve to provide an explanation of the inventions recorded overall by the application, which in each case independently develop the prior art at least by means of the following combinations of features, namely:

A transport module, which is characterised in that the mounting sections are spaced apart from one another in the radial direction, with respect to the axis of the coupling duct 7, by a deformation zone.

A coupling device, which is characterised in that the mounting sections are spaced apart from one another in the radial direction, with respect to the axis of the coupling duct 7, by a deformation zone.

A transport module or a coupling device, which is characterised in that the intermediate element 8 acting as a sealing element can be deformed elastically or plastically, and in particular is formed from an elastomer.

A transport module or a coupling device, which is characterised in that the intermediate element 8, acting as a sealing element, has an inner edge region bordering a window 16, which inner edge region forms a mounting section, and has an outer edge region running in particular parallel to the inner edge region, which forms the other mounting section, wherein the deformation zone is located between the two edge regions.

A transport module or a coupling device, which is characterised in that the intermediate element 8, and in particular the flexurally elastic deformation zone, extends in one plane.

A transport module or a coupling device, which is characterised by holding frames 13, 15, 13 which engage on the inner and outer edge regions of the sealing element 8 respectively, and clamp the sealing element 8 in a vacuum-tight manner against a land 14 of a flange element forming the flange plate 9, and against a land 23 of a mounting frame 12, 12' formed by the wall of the coupling duct 7.

A transport module or a coupling device, which is characterised in that the flange plate 9 is mounted on the inner edge region and the wall 12, 12' of the coupling duct 7 is mounted on the outer edge region.

A transport module or a coupling device, which is characterised by an in particular peripheral rib 19, which presses into the surface of the sealing element 8.

A transport module or a coupling device, which is characterised in that the peripheral rib 19 is formed on a holding frame 13, 15.

A transport module or a coupling device, which is characterised in that the holding frame 13 forms a projection 22, which is located against a seating face 23.

All disclosed features are essential to the invention (individually, or also in combination with one another). In the disclosure of the application the disclosure content of the related/attached convention documents (copy of the prior application) is hereby also included in full, also for the purpose of incorporating features of these documents in claims of the present application. The dependent claims characterise with their features independent inventive developments of the prior art, in particular for purposes of undertaking divisional applications on the basis of these claims.

| List of reference symbols | |
|---|---|
| 1 | Process module |
| 2 | Transport module |
| 3 | Housing |
| 4 | Chamber |
| 5 | Closure device |

-continued

List of reference symbols

| | |
|---|---|
| 6 | Opening |
| 7 | Coupling duct |
| 8 | Intermediate element |
| 9 | Flange plate |
| 9' | Sealing face |
| 10 | Coupling duct |
| 11 | Flange plate |
| 11' | Sealing face |
| 12 | Mounting frame |
| 12' | Mounting frame |
| 13 | Holding frame |
| 14 | Land |
| 15 | Holding frame |
| 16 | Window |
| 17 | Mounting opening |
| 18 | Mounting opening |
| 19 | Rib |
| 20 | Seal |
| 21 | Seal |
| 22 | Projection |
| 23 | Seating face |
| 24 | Mounting bolt |
| 25 | Gripper |
| 26 | Susceptor |
| 27 | Rail |
| 28 | Supply duct |
| 29 | Rack |
| 30 | Carriage |
| 31 | Clamp |
| 32 | Mounting bolt |
| 33 | Flange section |

What is claimed is:

1. A transport module (2) for loading and unloading a process module (1) of a semiconductor production device, the process module (1) with a housing (3), which has a chamber (4) that can be evacuated, the chamber (4) having an opening (6) that can be closed in a gas-tight manner by a closure device (5), the opening (6) opening out into a first coupling duct (7) associated with the transport module (2), the first coupling duct (7) connected with a first flange plate (9) using an elastically deformable sealing element (8), wherein the first flange plate (9) runs parallel to and is arranged in a sealing manner with respect to a second flange plate (11) of a second coupling duct (10) associated with the process module (1), so that after opening the closure device (5) an evacuated loading and unloading duct to the process module (1) is created, wherein a first mounting section of the sealing element (8) is connected with the first flange plate (9), and a second mounting section of the sealing element (8) is connected with a mounting frame (12, 12') of the first coupling duct (7), wherein the first and second mounting sections are spaced apart from one another in a radial direction, with respect to a longitudinal axis of the first coupling duct, by the sealing element, the transport module (2) characterised in that, a peripheral rib (19) is formed by a first holding frame (13), which presses into a surface of the sealing element (8), wherein the first holding frame (13) features a projection (22), which, located against a seating face (23) of the mounting frame (12, 12'), defines a clearance width of a clearance space, in which the sealing element (8) and the peripheral rib (19) are located.

2. The transport module of claim 1, wherein the sealing element (8) is formed from an elastomer.

3. The transport module of claim 1, wherein the sealing element has an inner edge region bordering a window (16), which inner edge region forms the first mounting section, and has an outer edge region running parallel to the inner edge region, which forms the second mounting section, wherein a deformation zone of the sealing element (8) is located between the inner and outer edge regions.

4. The transport module of claim 3,
wherein a second holding frame (13, 15) engages on the inner edge region of the sealing element (8), and clamps the sealing element (8) in a vacuum-tight manner against a land (14) of a flange element forming the first flange plate (9), and
wherein the first holding frame (13) engages on the outer edge region of the sealing element (8), and clamps the sealing element (8) in a vacuum-tight manner against the seating face (23) of the mounting frame (12, 12') formed by a wall of the first coupling duct (7).

5. The transport module of claim 3, wherein the first flange plate (9) is mounted on the inner edge region, and the mounting frame (12, 12') of the first coupling duct (7) is mounted on the outer edge region.

6. The transport module of claim 1, wherein the sealing element (8) and a flexurally elastic deformation zone of the sealing element (8) extend in one plane.

7. A coupling device for creating a loading and unloading duct between a transport module (2) and a process module (1) of a semiconductor production device by bringing together a first flange plate (9) of a first coupling duct (7) of the transport module (2), and a second flange plate (11) of a second coupling duct (10) of the process module (1), wherein the first flange plate runs parallel to the second flange plate, wherein the first flange plate (9) is connected with the first coupling duct (7) using an elastically deformable sealing element (8), wherein a first mounting section of the sealing element (8) is connected with the first flange plate (9), and a second mounting section of the sealing element (8) is connected with a mounting frame (12, 12') of the first coupling duct (7), wherein the first and second mounting sections are spaced apart from one another in a radial direction, with respect to a longitudinal axis of the first coupling duct, by the sealing element, the coupling device characterised in that, a peripheral rib (19) is formed by a first holding frame (13), which presses into a surface of the sealing element (8), wherein the first holding frame (13) features a projection (22), which, located against a seating face (23) of the mounting frame (12, 12'), defines a clearance width of a clearance space, in which the sealing element (8) and the peripheral rib (19) are located.

8. The coupling device of claim 7, wherein the sealing element is formed from an elastomer.

9. The coupling device of claim 7, wherein the sealing element has an inner edge region bordering a window (16), which inner edge region forms the first mounting section, and has an outer edge region running parallel to the inner edge region, which forms the second mounting section, wherein a deformation zone of the sealing element (8) is located between the inner and outer edge regions.

10. The coupling device of claim 9,
wherein a second holding frame (15) engages on the inner edge region of the sealing element (8), and the sealing element (8) in a vacuum-tight manner against a land (14) of a flange element forming the first flange plate (9), and
wherein the first holding frame (13) engages on the outer edge region of the sealing element (8) and clamps the sealing element (8) in a vacuum-tight manner against the seating face (23) of the mounting frame (12, 12') formed by a wall of the first coupling duct (7).

11. The coupling device of claim 9, wherein the first flange plate (9) is mounted on the inner edge region, and the mounting frame (12, 12') of the first coupling duct (7) is mounted on the outer edge region.

12. The coupling device of claim 7, wherein the sealing element (8) and a flexurally elastic deformation zone of the sealing element extend in one plane.

\* \* \* \* \*